United States Patent
Takagimoto et al.

(10) Patent No.: US 7,432,761 B2
(45) Date of Patent: Oct. 7, 2008

(54) AMPLIFIER CIRCUIT, SEMICONDUCTOR DEVICE AND ELECTRONIC APPARATUS

(75) Inventors: Shinsuke Takagimoto, Kyoto (JP); Koji Miyamoto, Kyoto (JP)

(73) Assignee: Rohm Co., Ltd. (JP)

( * ) Notice: Subject to any disclaimer, the term of this patent is extended or adjusted under 35 U.S.C. 154(b) by 72 days.

(21) Appl. No.: 11/658,102

(22) PCT Filed: Jun. 17, 2005

(86) PCT No.: PCT/JP2005/011171
§ 371 (c)(1),
(2), (4) Date: Jan. 22, 2007

(87) PCT Pub. No.: WO2006/011316
PCT Pub. Date: Feb. 2, 2006

(65) Prior Publication Data
US 2008/0024186 A1    Jan. 31, 2008

(30) Foreign Application Priority Data
Jul. 23, 2004    (JP) .............................. 2004-215314

(51) Int. Cl.
*H03F 21/00* (2006.01)
(52) U.S. Cl. .......................................... 330/11; 330/51
(58) Field of Classification Search .................. 330/11, 330/51, 252, 255
See application file for complete search history.

(56) References Cited
U.S. PATENT DOCUMENTS
4,545,076 A * 10/1985 Biard et al. ................. 398/208
5,767,744 A * 6/1998 Irwin et al. .................. 330/297
5,905,617 A * 5/1999 Kawasoe ...................... 361/86

FOREIGN PATENT DOCUMENTS

| | | |
|---|---|---|
| JP | 3-121603 | 5/1991 |
| JP | 4-345960 | 12/1992 |
| JP | 5-191186 | 7/1993 |
| JP | 5-328774 | 12/1993 |
| JP | 10-56796 | 2/1998 |
| JP | 10-98896 | 4/1998 |
| JP | 2003-258581 | 9/2003 |

OTHER PUBLICATIONS

Written Opinion of the International Searching Authority for International Application No. PCT/JP2005/011171.

* cited by examiner

*Primary Examiner*—Henry K Choe
(74) *Attorney, Agent, or Firm*—Cantor Colburn LLP

(57) ABSTRACT

It is desirable that some voltage can be supplied as emergency backup even upon occurrence of abnormality such as a failure. The amplifier circuit in a semiconductor device supplies an output signal having a voltage produced by amplifying an input voltage Vin from a variable voltage source to one end of a coil load, and supplies a predetermined fixed voltage of 0V, for example, to the other end of the coil load to rotate the coil load with the voltage difference between these output signals, thus performing loading control of a CD tray and a DVD tray. The semiconductor device clamps the voltage of the output signal to a predetermined non-zero voltage so that a sufficient drive voltage can be obtained even if a loading control terminal T1 is grounded, thus realizing emergency backup loading control of the tray.

11 Claims, 3 Drawing Sheets

US 7,432,761 B2

AMPLIFIER CIRCUIT, SEMICONDUCTOR DEVICE AND ELECTRONIC APPARATUS

CROSS REFERENCE TO RELATED APPLICATIONS

This is a U.S. national stage of application No. PCT/JP2005/011171, filed on 17 Jun. 2005. Priority under 35 U.S.C. §119(a) and 35 U.S.C. §365(b) is claimed from Japanese Application No. 2004-215314, filed 23 Jul. 2004, the disclosure of which is also incorporated herein by reference.

TECHNICAL FIELD

This invention relates to an amplifier circuit which amplifies a voltage to be supplied to a targeted load, and a semiconductor device and an electronic apparatus utilizing the same.

BACKGROUND TECHNOLOGY

Personal computers, car navigation equipment and audio equipment of recent years are often provided with a tray for allowing the entry and exit of a CD (Compact Disk) or a DVD (Digital Versatile Disk). The opening and closing of the tray are normally controlled by the drive of a load, such as a coil or motor including a rotor. There are proposals for various methods for load drive control; for example, Patent Document 1 discloses a technology in which a torque value to be supplied to a motor is controlled by detecting the speed and position of the motor and comparing the results of detection with target values.

[Patent Document 1]

Japanese Patent Application Laid-Open No. Hei05-328774.

Conventionally, there have been cases where an amplifier circuit for amplifying input voltage is used to supply drive voltage to a load, such as a motor. However, when a fault occurs in the amplifier circuit or in a circuit near it due to a certain factor, there have been cases where a sufficient drive voltage cannot be supplied to the load or, under certain circumstances, the function of the equipment is impaired. For example, when a short circuit occurs in the amplifier circuit or in a circuit near it, the drive voltage supplied to the load may become 0 V, and the tray may not be opened or closed. Therefore, it is preferable that even in an emergency, such as the occurrence of a fault, a certain voltage can be supplied as an act of necessity.

DISCLOSURE OF THE INVENTION

The present invention has been made in view of the problem as described above, and an object thereof is to provide an amplifier circuit capable of supplying a certain voltage in an emergency as an act of necessity, and a semiconductor apparatus and an electronic apparatus using it.

An embodiment of the present invention relates to an amplifier circuit. This amplifier circuit includes a clamp circuit which clamps a voltage corresponding to an input voltage, to a predetermined nonzero voltage. According to this embodiment, even if, for example, the voltage corresponding to the input voltage becomes a voltage value in the neighborhood of a ground potential, the voltage of a constant level can be secured. This amplifier circuit may further include a differential circuit which generates, as the voltage corresponding to the input voltage, an amplification voltage corresponding to a difference between the input voltage and a reference voltage, and when the difference between the input voltage and the reference voltage is zero, the clamp circuit may clamp a voltage corresponding to the amplification voltage, to a predetermined nonzero voltage. Thereby, even if the input voltage becomes equal to the reference voltage, the voltage corresponding to the amplification voltage obtained by the differential circuit is clamped to a predetermined nonzero voltage, so that the voltage of a constant level can be secured. This amplifier circuit may further include a compensation circuit which compensates for temperature characteristics of the clamp circuit. The clamp circuit may be a transistor of bipolar type.

Another embodiment of the present invention relates also to an amplifier circuit. This amplification circuit amplifier circuit comprises: a differential circuit which generates an amplification voltage corresponding to a difference between an input voltage and a reference voltage; a first output circuit which generates a first output signal upon receipt of input of the amplification voltage from the differential circuit; a second output circuit which generates a second output signal upon receipt of input of the amplification voltage from the differential circuit; and a selector circuit which selects either the first output circuit or the second output circuit, wherein when the first output circuit is selected by the selector circuit, the first output circuit outputs a voltage corresponding to the amplification voltage from the differential circuit and the second output circuit outputs a predetermined fixed voltage, wherein when the second output circuit is selected by the selector circuit, the second output circuit outputs a voltage corresponding to the amplification voltage from the differential circuit and the first output circuit outputs a predetermined fixed voltage, wherein the first output circuit includes a first clamp circuit which generates a clamp voltage so that the first output signal does not become a predetermined clamp voltage or below, irrespective of the amplification voltage from the differential circuit, and the first output circuit outputs the first output signal with a nonzero voltage in the event that the input voltage is equal to the reference voltage, and wherein the second output circuit includes a second clamp circuit which generates a clamp voltage so that the second output signal does not become a predetermined clamp voltage or below, irrespective of the amplification voltage from the differential circuit, and the second output circuit outputs the second output signal with a nonzero voltage in the event that the input voltage is equal to the reference voltage. This amplifier circuit may further comprise a compensation circuit which compensates for temperature characteristics of the first clamp circuit and the second clamp circuit. The first clamp circuit and the second clamp circuit may be transistors of bipolar type.

Still another embodiment of the present invention relates also to an amplifier circuit. This amplifier circuit comprises: a first transistor in which an input voltage or a voltage corresponding to the input voltage is inputted to a base thereof and a collector thereof is grounded; a constant-current source connected with an emitter of the first transistor; and a second transistor in which a supply voltage is connected with an emitter thereof and a collector thereof is connected with a load, wherein a path from a connection point of the first transistor and the constant-current source to a base of the second transistor is selectively configured to be either in a conductive state or in a nonconductive state, wherein the first transistor generates a clamp voltage in a manner such that a voltage obtained from the connection point does not become a predetermined clamp voltage or below, and wherein when the path is in a conductive state, the second transistor retrieves the clamp voltage generated by the first transistor.

Still another embodiment of the present invention relates to a semiconductor device. This semiconductor device includes any of the above-described amplifier circuits. Still another embodiment of the present invention relates also to a semiconductor device. This semiconductor device comprises: a differential circuit which generates an amplification voltage corresponding to a difference between an input voltage and a reference voltage; a first output circuit which generates a first output signal upon receipt of input of the amplification voltage from the differential circuit; a second output circuit which generates a second output signal upon receipt of input of the amplification voltage from the differential circuit; a selector circuit which selects either the first output circuit or the second output circuit; and a load connected between a first output terminal that outputs the first output signal and a second output terminal that outputs a second output terminal, wherein when the first output circuit is selected by the selector circuit, the first output circuit outputs a voltage corresponding to the amplification voltage from the differential circuit and the second output circuit outputs a predetermined fixed voltage, wherein when the first output circuit is selected by the selector circuit, the second output circuit outputs a voltage corresponding to the amplification voltage from the differential circuit and the first output circuit outputs a predetermined fixed voltage, wherein the first output circuit includes a first clamp circuit which generates a clamp voltage so that the first output signal does not become a predetermined clamp voltage or below, irrespective of the amplification voltage from the differential circuit, and the first output circuit outputs the first output signal with a nonzero voltage in the event that the input voltage is equal to the reference voltage, and wherein the second output circuit includes a second clamp circuit which generates a clamp voltage so that the second output signal does not become a predetermined clamp voltage or below, irrespective of the amplification voltage from the differential circuit, and the second output circuit outputs the second output signal with a nonzero voltage in the event that the input voltage is equal to the reference voltage.

Still another embodiment of the present invention relates to an electronic apparatus. This electronic apparatus includes the above-described semiconductor device.

EFFECTS OF THE INVENTION

According to the present invention, the voltage of a constant level can be secured.

Figure 1:
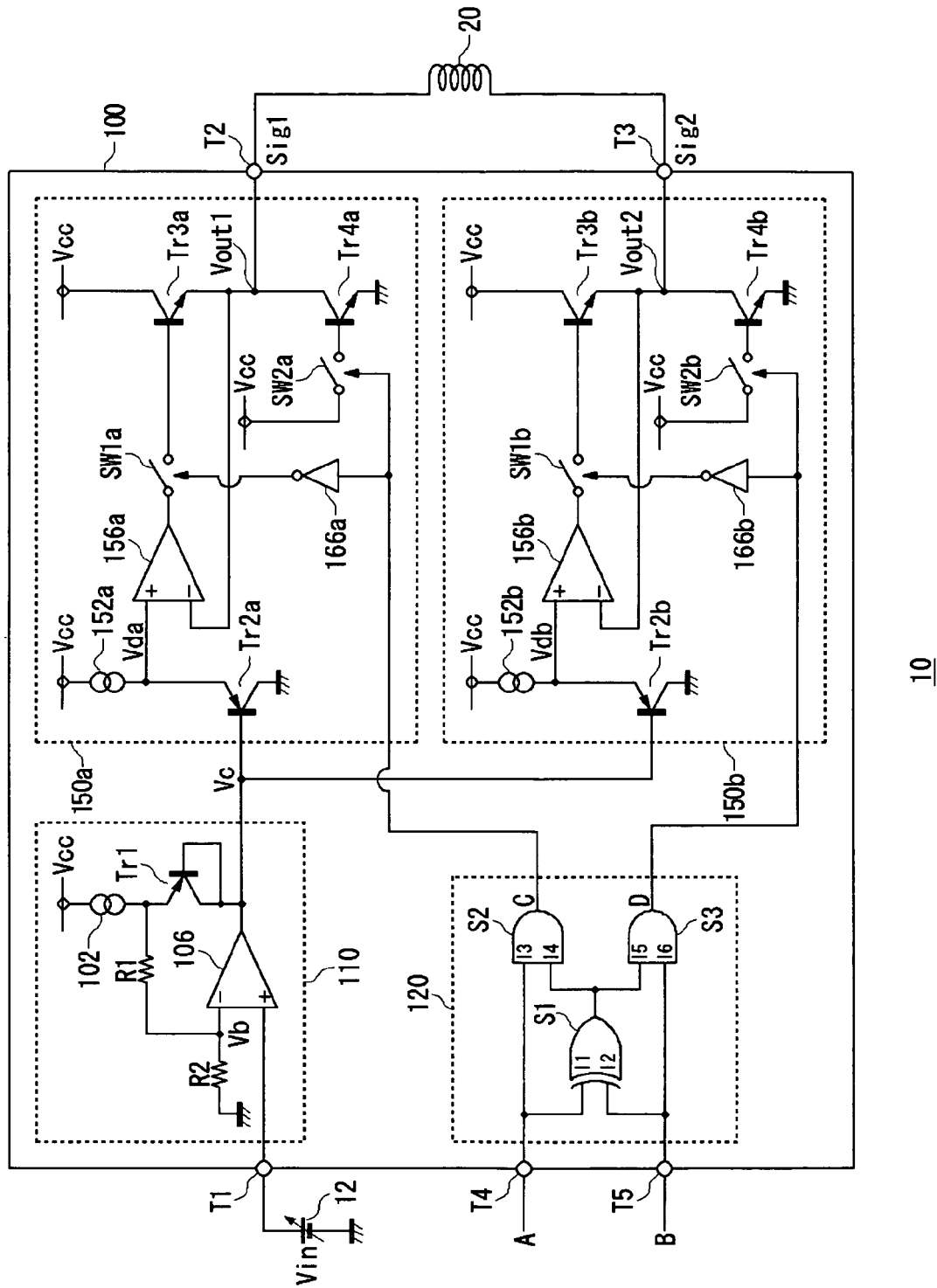
FIG. 1 shows a structure of a semiconductor device according to an embodiment.

DESCRIPTION OF REFERENCE NUMERALS 10 semiconductor device, 20 coil load, 50 electronic apparatus, 100 amplifier circuit, 110 differential circuit, 120 selector circuit, 150a first output circuit, 150b second output circuit, T2 first output terminal, T3 second output terminal, Tr1 first transistor, Tr2a second transistor, Tr2b fifth transistor, Vin input voltage, Vb reference voltage, Vc amplification voltage, Vout1 first output signal, Vout2 second output signal

THE BEST MODE FOR CARRYING OUT THE INVENTION

Firstly, an embodiment will be outlined. A semiconductor device according to the present embodiment is incorporated into an electronic equipment, such as a personal computer, a car navigation equipment, or an audio equipment, and carries out the opening and closing control of a CD tray or a DVD tray (hereinafter referred to as "loading control" as appropriate). An amplifier circuit in a semiconductor device is a so-called differential amplifier circuit and generates an amplification voltage corresponding to the difference between an input voltage from a variable voltage source and a reference voltage. The semiconductor device drives a rotor by supplying an output signal of a voltage corresponding to the amplification voltage (hereinafter sometimes referred to simply as "intermediate voltage" also) to one end of a coil load and an output signal of a predetermined fixed voltage, for instance, 0 V to the other end of the coil load and thereby having a current flow to the coil load by the voltage difference between those output signals. Hereinbelow, a rotor and a coil load are collectively referred to simply as a coil load.

This semiconductor device, excluding at least a variable voltage source and a coil load, is integrated in a package as a semiconductor circuit. It goes without saying that, depending on the semiconductor manufacturing process, the variable voltage source may also be integrated therewith. Although, as mentioned above, a semiconductor circuit including at least an amplifier circuit is used incorporated into an electronic equipment, such as a car navigation equipment or an audio equipment, there is the following agreement between a party that designs the semiconductor circuit, for example, an LSI (Large Scale Integration) maker, and a party that designs a set, such as a car navigation equipment or an audio equipment, by connecting a variable voltage source to a terminal of the LSI, for example, a set maker. That is, an LSI maker instructs a set maker to develop a packaging for application of a predetermined voltage to a terminal as LSI specifications. The set maker, following such instructions, develops the packaging for application of the predetermined voltage to the terminal.

After a semiconductor circuit is mounted on an electronic equipment by a set maker and the electronic equipment is shipped as a product, there may be a case where the variable voltage source breaks down due to a certain factor and the terminal is short-circuited to the ground. It is possible to cite an erroneous operation by a user, a physical shock having occurred during product transportation, etc., as above-mentioned factors. At this time, the input voltage may be 0 V and there will be zero difference between the input voltage and the reference voltage, so that the amplification voltage will take a voltage value in the neighborhood of ground potential, for instance, 0 V. At this time, if the amplification voltage, as it is, is supplied to the coil load, the voltage difference between the amplification voltage and the predetermined fixed voltage will be zero, and therefore the semiconductor device cannot drive the coil load and thus cannot perform the loading control of the tray. Accordingly, in a semiconductor device according to the present embodiment, a clamp circuit, which generates a voltage corresponding to the amplification voltage, namely, an intermediate voltage, is provided so as to clamp the intermediate voltage to a predetermined "nonzero" voltage when the terminal is short-circuited to the ground, that is, when the difference between the input voltage and the reference voltage is zero. In this manner, the semiconductor device can supply some fixed level of voltage to the coil load even in an emergency, thus realizing an emergency loading control of the tray.

Figure 3:
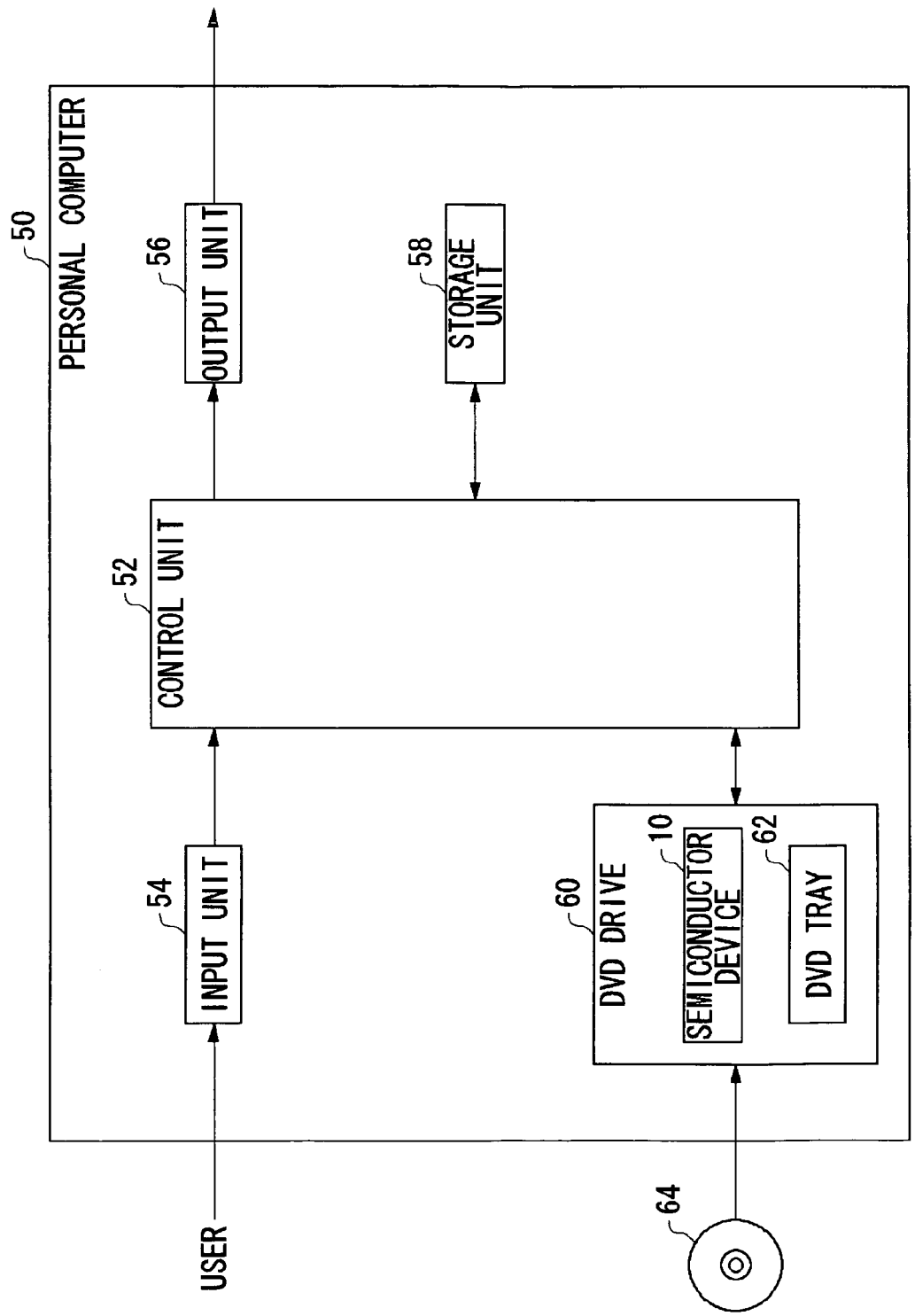
FIG. 3 shows a structure of an electronic equipment according to an embodiment.

FIG. 1 shows a structure of a semiconductor device 10. FIG. 3 shows a structure of a personal computer 50 as an example of an electronic equipment carrying a semiconductor device 10 as shown in FIG. 1. The personal computer 50 shown in FIG. 3 includes an input unit 54, which receives inputted instructions from a user via an external device (not shown), such as a mouse or a keyboard; a DVD drive 60, in which a DVD 64 is loaded; a storage unit 58, such as a hard disk or memory for storage of files or data; a control unit 52, such as a CPU (Central Processing Unit) that carries out exchange of data and signals with each component carried in the personal computer 50 and control of data input/output and operation of each component; and an output unit 56, which outputs data stored in the DVD 64 or the storage unit 58 via an external display (not shown). The DVD drive 60 includes a DVD tray 62 for loading the DVD 64 and a semiconductor device 10 for the loading control of the DVD tray 62. The control unit 52 according to the present embodiment carries out a loading control of the DVD tray 62 by outputting different signals to the semiconductor device 10 at a timing for drawing out the DVD tray 62, at a timing for returning it, and at a timing without unloading or loading, respectively. While FIG. 3 shows a personal computer as an example of an electronic equipment, the electronic equipment may be a car navigation equipment or an audio equipment as other examples.

Returning to FIG. 1, the semiconductor device 10 according to the present embodiment includes a variable voltage source 12, a coil load 20, and an amplifier circuit 100. Note that the rotor is now shown. The amplifier circuit 100 amplifies an input voltage Vin inputted from the variable voltage source 12 via a loading control terminal T1 and supplies it to the coil load 20. The positive electrode side of the variable voltage source 12 is connected to the loading control terminal T1 of the amplifier circuit 100, whereas the negative electrode side of the variable voltage source 12 is grounded. According to the present embodiment, the input voltage Vin to the amplifier circuit 100 is variable, but it may, or course, be fixed. If the input voltage Vin is variable, it is possible to control the revolution speed of the coil load 20 according to the voltage value of the input voltage Vin, and consequently, it is possible to control the speed of unloading/loading of the tray.

The coil load 20 is connected between a first output terminal T2 and a second output terminal T3 of the amplifier circuit 100. A first output signal Sig1 is supplied via the first output terminal T2, and a second output signal Sig2 is supplied via the second output terminal T3. Although the detail will be described later, when the first output signal Sig1 is active and at the same time the second output signal Sig2 is a predetermined fixed voltage, the coil load 20 rotates in positive direction and the tray is inserted into the equipment. On the other hand, in a reverse situation, the coil load rotates in reverse direction and the tray is drawn out of the equipment. The switching of these output signals is done by a selector circuit 120 to be described later. The predetermined fixed voltage in the present embodiment is a voltage value in the neighborhood of ground potential, which is 0 V for instance.

The amplifier circuit 100 includes a differential circuit 110 for generating an amplification voltage Vc corresponding to the difference between an input voltage Vin and a reference voltage Vb; a first output circuit 150a for outputting a first output signal Sig1 upon receipt of the input of an amplification voltage Vc from the differential circuit 110; a second output circuit 150b for outputting a second output signal Sig2 upon receipt of the input of an amplification voltage Vc from the differential circuit 110; and a selector circuit 120 for selecting either one of the first output circuit 150a and the second output circuit 150b. The first output circuit 150a and the second output circuit 150b are referred to as the output circuit 150 as appropriate.

The differential circuit 110 includes a first constant-current source 102, a first transistor Tr1 of PNP type, a first differential amplifier 106, a first voltage-dividing resistor R1, and a second voltage-dividing resistor R2. Here, note also that the resistance values of the first voltage-dividing resistor R1 and the second voltage-dividing resistor R2 are denoted by R1 and R2, respectively.

An input voltage Vin from the variable voltage source 12 is inputted to a noninverting input terminal of the first differential amplifier 106 via a loading control terminal T1. The emitter of the first transistor Tr1 is connected to one end of the first constant-current source 102, the collector is connected to the output side of the first differential amplifier 106, and furthermore the base is connected to the collector. The other end of the first constant-current source 102 is connected to a supply voltage source Vcc. Here, a threshold voltage between the base and emitter of the first transistor Tr1 is denoted by Vbe. This threshold voltage Vbe is a voltage at which an on-off switching of the transistor takes place, for instance, 0.7 V. Note that 0.7 V is a constant level of voltage value where the coil load 20 can be driven. Also, as will be described later, the first transistor Tr1 is provided to compensate for the temperature characteristics of a second transistor Tr2a and a fifth transistor Tr2b.

The voltage occurring between the emitter of the first transistor Tr1 and the first constant-current source 102 is voltage-divided into a reference voltage Vb by the first voltage-dividing resistor R1 and the second voltage-dividing resistor R2 and inputted to the inverting input terminal of the first differential amplifier 106. The first constant-current source 102 controls the current to be sent to the first transistor Tr1, the first voltage-dividing resistor R1, and the second voltage-dividing resistor R2.

Here, the amplification voltage Vc outputted by the first differential amplifier 106 is expressed, using the input voltage Vin, as:

$$Vc = Vin \times (R1+R2)/R2 - Vbe \quad (1)$$

As is indicated by the above equation (1), the larger the input voltage Vin, the larger the amplification voltage Vc will be. When a voltage value Vin in the neighborhood of ground potential is inputted, the amplification voltage Vc may be a negative voltage value or a voltage value near 0 V.

The selector circuit 120 controls the first output signal Sig1 and the second output signal Sig2 by controlling the ons and offs of various switches within the first output circuit 150a and second output circuit 150b to be described later, and thereby controls the coil load 20. More specifically, the selector circuit 120 selects either one of the first output signal Sig1 and the second output signal Sig2 as a voltage signal corresponding to the amplification voltage Vc and the other thereof as a predetermined fixed voltage.

The selector circuit 120 includes an XOR gate S1, a first AND gate S2, and a second AND gate S3. A FWD signal A is inputted to a first input terminal I1 of the XOR gate S1 and a third input terminal I3 of the first AND gate S2 via a FWD terminal T4. A REV signal B is inputted to a second input terminal I2 of the XOR gate S1 and a sixth input terminal I6 of the second AND gate S3 via a REV terminal T5. The XOR gate S1 performs an exclusive-OR operation on the two input signals and outputs the result of the operation to a fourth input terminal I4 of the first AND gate S2 and a fifth input terminal I5 of the second AND gate S3. The first AND gate S2 and the second AND gate S3 perform AND operations on the inputted signals and control the various switches within the first output circuit 150a and the second output circuit 150b, respectively, using the results of the AND operations as a first control signal C and a second control signal D, respectively.

The selector circuit 120 controls the ons and offs of the various switches within the first output circuit 150a and the second output circuit 150b according to the H level and L level of the FWD signal A and the REV signal B given by a control unit 52 as shown in FIG. 3. In this manner, the selector circuit 120 selectively turns the path to be described later of either one of the first output circuit 150a and the second output circuit 150b into a conductive state or a nonconductive state. When the coil load 20 is run in positive rotation, that is, when the tray is inserted into the equipment, a FWD signal A of H level and at the same time a REV signal B of L level are inputted to the selector circuit 120. At this time, the selector circuit 120 outputs a first control signal C of H level and a second control signal D of L level. As a result, the first output circuit 150a is selected, and the amplifier circuit 100 outputs a voltage corresponding to the amplification voltage Vc from the differential circuit 110 as the first output signal Sig1 and a predetermined fixed voltage as the second output signal Sig2. In the present embodiment, it is to be noted that a signal of L level turns on a switch and a signal of H level turns off a switch.

When the coil load 20 is run in reverse rotation, that is, when the tray is drawn out of the equipment, a FWD signal A of L level and at the same time a REV signal B of H level are inputted. At this time, the selector circuit 120 outputs a first control signal C of L level and a second control signal D of H level. As a result, the second output circuit 150b is selected, and the amplifier circuit 100 outputs a voltage corresponding to the amplification voltage Vc from the differential circuit 110 as the second output signal Sig2 and a predetermined fixed voltage as the first output signal Sig1.

Further, when the coil load 20 is not driven, that is, when the tray is not opened or closed because the CD or DVD is being used by the equipment, a FWD signal A and a REV signal B, which are both H level or L level, are inputted. At this time, the selector circuit 120 outputs a first control signal C and a second control signal D, which are both of L level. At this time, neither of the first output circuit 150a and the second output circuit 150b is selected. As a result, a predetermined fixed voltage is applied to both ends of the coil load 20, so that the coil load 20 is not driven.

The output circuit 150 generates an output signal of a voltage corresponding to the amplification voltage Vc supplied by the differential circuit 110, and supplies the output signal to one end of the coil load 20 via the first output terminal T2 or the second output terminal T3. A predetermined fixed voltage is applied to the other end of the coil load 20. As mentioned above, the switching control of the output signal is done by the selector circuit 120. The first output circuit 150a and the second output circuit 150b are connected in parallel between the differential circuit 110 and the coil load 20. Since the second output circuit 150b has a structure identical to that of the first output circuit 150a, a description will be given hereinbelow of the first output circuit 150a and the description of the second output circuit 150b will be omitted as appropriate.

The first output circuit 150a is provided therewithin with a second transistor Tr2a of bipolar PNP type which generates a clamp voltage to prevent the first output signal Sig1 from going below a predetermined clamp voltage, without depending on the value of the amplification voltage Vc from the differential circuit 110. Although the detail will be described later, because of this second transistor Tr2a, a first output signal Sig1 can be outputted at a nonzero voltage even when the input voltage Vin is equal to the reference voltage Vb.

The first output circuit 150a includes a second constant-current source 152a, a second transistor Tr2a, a second operational amplifier 156a, a third transistor Tr3a of NPN type, a fourth transistor Tr4a of NPN type, a first switch SW1a, a second switch SW2a, and an inverting circuit 166a.

The collector of the second transistor Tr2a is grounded, and the emitter is connected to one end of the second constant-current source 152a. The other end of the second constant-current source 152a is connected to a supply voltage source Vcc. The intermediate voltage Vda between the emitter of the second transistor Tr2a and the second constant-current source 152a is inputted to the noninverting input terminal of the second operational amplifier 156a which constitutes a so-called voltage follower. The output side of the second operational amplifier 156a is connected to the base of the third transistor Tr3a via the first switch SW1a. The collector of the third transistor Tr3a is connected to the supply voltage source Vcc and further connected to the inverting input terminal of the second operational amplifier 156a, and the emitter is connected to the collector of the fourth transistor Tr4a. The emitter of the fourth transistor Tr4a is grounded, and the base is connected to the supply voltage source Vcc via the second switch SW2a. A first output signal Sig1 of a first output voltage Vout1 occurring between the emitter of the third transistor Tr3a and the collector of the fourth transistor Tr4a is supplied to one end of the coil load 20 via the first output terminal T2.

When the first output circuit 150a is selected by the selector circuit 120, the first switch SW1a is turned on, the second switch SW2a off, the third switch SW1b off, and the fourth switch SW2b on. At this time, the path leading from the connection point between the emitter of the second transistor Tr2a and the second constant-current source 152a to the third transistor Tr3a goes into a conductive state, and a voltage corresponding to the amplification voltage Vc is outputted via the second operational amplifier 156a in the first output circuit 150a and the first output circuit 150a. Also, the output from a third operational amplifier 156b in the second output circuit 150b is cut off by the third switch SW1b in the off state, a seventh transistor Tr4b is turned on, and a predetermined fixed voltage is outputted. On the other hand, when the second output circuit 150b is selected by the selector circuit 120, the first switch SW1a is turned off, the second switch SW2a on, the third switch SW1b off, and the fourth switch SW2b on.

According to the present embodiment, the threshold voltage between the base and emitter of the second transistor Tr2a is the same as the threshold voltage Vbe between the base and emitter of the first transistor Tr1. The intermediate voltage Vda, which takes a value of the threshold voltage Vbe added to the amplification voltage Vc, is expressed as:

$$Vda = Vc + Vbe \qquad (2)$$
$$= Vin \times (R1 + R2)/R2$$

When the coil load 20 is driven in positive rotation, the first output voltage Vout1 is equal to Vda and thus can be expressed, using the input voltage Vin, as follows:

$$Vout1 = Vin \times (R1+R2)/R2$$

The threshold voltage Vbe between the base and emitter of the second transistor Tr2a goes down gradually due to the heating resulting from use. At this time, if the first transistor Tr1 is not provided in the amplifier circuit 100, then there will be no factor of the threshold voltage Vbe on account of the first transistor Tr1 in the above equation (1). Consequently, the parameter of threshold voltage Vbe remains in the above equation (2), and the intermediate voltage Vda may change along with the change in the threshold voltage Vbe between the base and emitter of the second transistor Tr2a. As a result, even under the same conditions, for example, even if the same input voltage Vin and resistance values R1 and R2 are given, the gain will change with the passage of time.

In the present embodiment, a first transistor Tr1 is provided to compensate for the temperature characteristics of a second transistor Tr2a. When the threshold voltage Vbe between the base and emitter of the second transistor Tr2a drops, the threshold voltage Vbe between the base and emitter of the first transistor Tr1 drops the same way. At this time, according to the above equations (1) and (2), they are in such directions as to cancel out each other, and as a result, the change in the threshold voltage Vbe between the base and emitter of the second transistor Tr2a can be absorbed. As such, the change in the gain under the same conditions can be reduced. The fifth transistor Tr2b can obtain an effect similar to that of the second transistor Tr2a.

Hereinbelow, a description will be give of an operation of the semiconductor device 10 according to the present embodiment. According to the above equation (1), as the input voltage Vin increases, the amplification voltage Vc increases. However, as a result of the provision of a second transistor Tr2a, the following operation will be further performed. When the amplification voltage Vc increases, the degree of on of the second transistor Tr2a weakens and the collector current gets smaller. When the amplification voltage Vc further increases, the second transistor Tr2a is turned off, and as a result, an intermediate voltage Vda clamped to the voltage when it is turned off is inputted to the noninverting input terminal of the second operational amplifier 156a and is outputted as a first output voltage Vout1.

When a short-circuiting of a loading control terminal T1 to the ground takes place, an input voltage Vin which is in the neighborhood of ground potential, for instance, 0 V, is inputted to the noninverting input terminal of the first differential amplifier 106. At this time, the input voltage Vin becomes equal to the reference voltage Vb, and the amplification voltage Vc takes a voltage value in the neighborhood of ground potential, for instance 0 V. At this time, the second transistor Tr2a is turned on, a collector current which is rather large flows, and the intermediate voltage Vda is clamped to the threshold voltage Vbe between the base and emitter of the second transistor Tr2a and outputted as a first output voltage Vout1. Accordingly, even in an emergency, the intermediate voltage Vda is clamped to a nonzero predetermined voltage, which is the threshold voltage Vbe between the base and emitter of the second transistor Tr2a, so that a nonzero output signal can be supplied to the coil load 20. The second output circuit 150b also performs an operation similar to that of the first output circuit 150a.

Figure 2A:
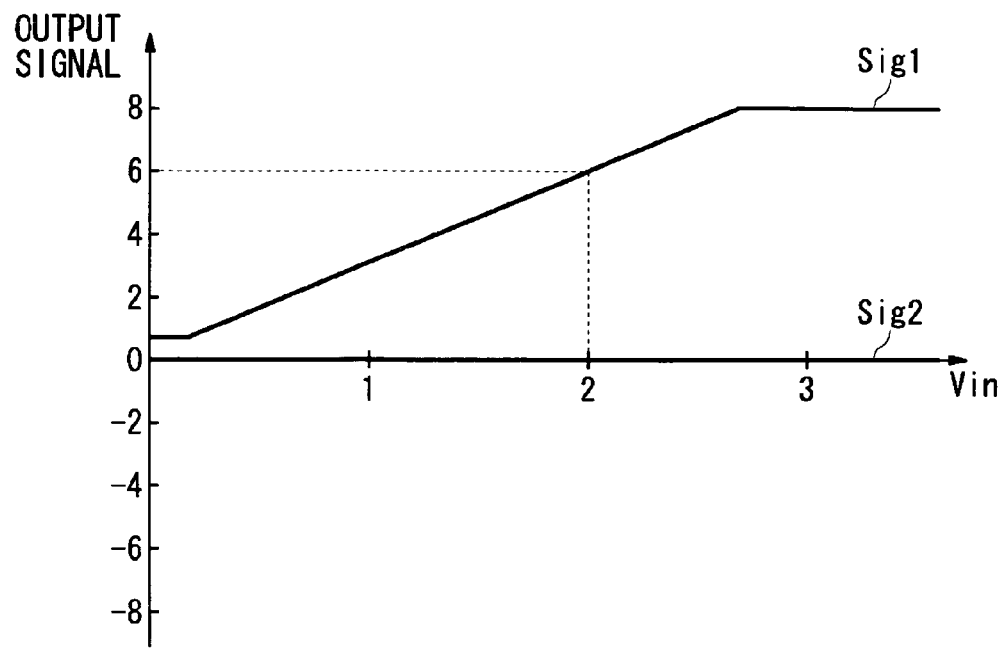
FIG. 2A shows a relationship between an input voltage and an output signal when an H-level signal is inputted to a FWD terminal and an L-level signal is inputted to a REV terminal.
Figure 2B:
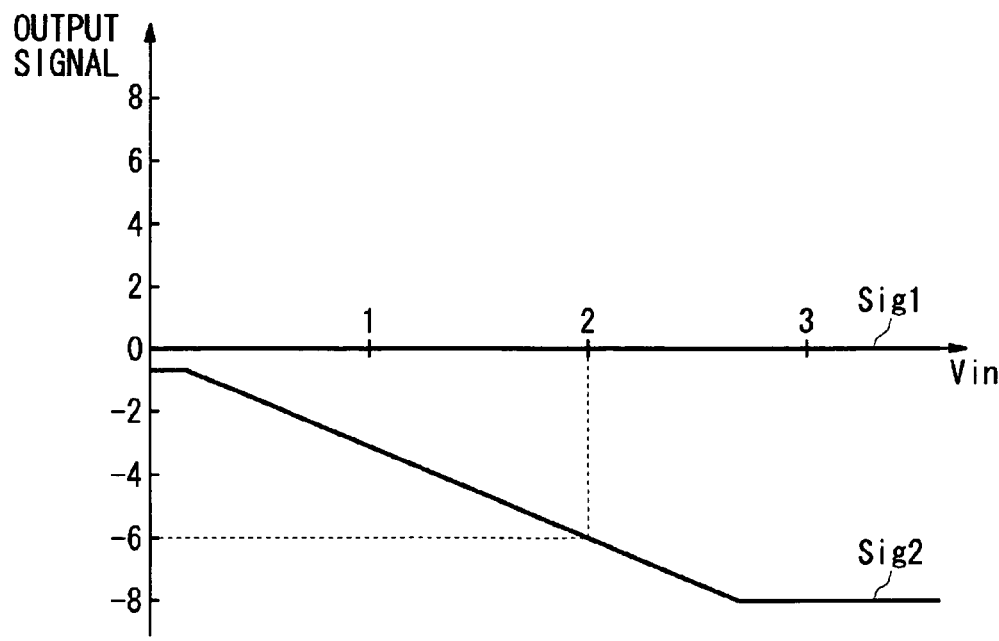
FIG. 2B shows a relationship between an input voltage and an output signal when an L-level signal is inputted to the FWD terminal and an H-level signal is inputted to the REV terminal.

Hereinbelow, a description will be given of how the output signal at an amplifier circuit 100 changes, using drawings. FIG. 2A shows a relationship between the input voltage Vin applied to a loading control terminal T1 and the output signal of the amplifier circuit 100 when an H-level signal is inputted to the FWD terminal T4 and an L-level signal to the REV terminal T5, and FIG. 2B shows a relationship between the input voltage Vin applied to a loading control terminal T1 and the output signal of the amplifier circuit 100 when an L-level signal is inputted to the FWD terminal T4 and an H-level signal is inputted to the REV terminal T5. The horizontal axis represents the input voltage Vin applied to the loading control terminal T1, and the vertical axis represents the output signal of the amplifier circuit 100.

As shown in FIG. 2A, when an H-level signal is inputted to the FWD terminal T4 and an L-level signal to the REV terminal T5, the first output signal Sig1 becomes active while the second output signal Sig2 becomes 0 v. As already described, the amplifier circuit 100 drives the coil load 20, using the voltage difference between the first output signal Sig1 and the second output signal Sig2. The greater the difference, the higher the revolution speed of the coil load 20 will be.

As shown in FIG. 2B, the first output signal Sig1 becomes 0 V while the second output signal Sig2 becomes active. The polarity of the second output signal Sig2 in FIG. 2B is opposite to the polarity of the first output signal Sig1 in FIG. 2A. This is the same as the case of FIG. 2A in that the coil load 20 is driven, using the voltage difference between the first output signal Sig1 and the second output signal Sig2, but it differs in that the coil load 20 is driven in reverse rotation.

As shown in FIG. 2A, the second transistor Tr2a generates a clamp voltage to prevent the first output signal Sig1 from dropping below a predetermined clamp voltage. Accordingly, even when a short-circuiting of the loading control terminal T1 to the ground has taken place, that is, even when the voltage applied to the loading control terminal T1 has taken a voltage value in the neighborhood of ground potential, for instance, 0 V, the amplifier circuit 100 can supply a nonzero and constant level of voltage to the coil load 20, thus realizing an emergency loading control of the tray.

The correspondence in structure between the present invention and the embodiments are exemplified here. "Clamp circuit" corresponds to the second transistor Tr2a and the fifth transistor Tr2b; a "first clamp circuit" corresponds to the second transistor Tr2a; a "second clamp circuit" corresponds to the fifth transistor Tr2b. A "compensation circuit" corresponds to the first transistor Tr1. "First transistor" corresponds to the second transistor Tr2a and the fifth transistor Tr2b, whereas a "second transistor" corresponds to the third transistor Tr3a.

The present invention has been described based on the embodiments. The embodiments are merely exemplary, and it is understood by those skilled in the art that various modifications to the combination of each component and process thereof are possible and such modifications are also within the scope of the present invention. Such modification will be described as follow.

An element to be driven by the amplifier circuit 100 in the embodiments was the coil load 20, but this should not be considered as limiting. Any equipment that operates by using the amplifier circuit 100 as a means for supplying the power will serve the purpose. For example, it may be a motor, an LED element, an organic EL (Electro-Luminescence) element, a heater, a fan or a communication unit. According to this modification, in an emergency such as the occurrence of a fault, nonzero clamp voltage is delivered as a drive voltage in order that no voltage less than or equal to a predetermined voltage should occur, so that a certain drive can be achieved as an act of necessity in an emergency.

Although the amplifier circuit 100 according to the present embodiment is provided with the differential circuit 110, the amplifier circuit 100 excluding the difference circuit 110 is proposed here. Then, the input voltage Vin, from the variable voltage source 12, which has been inputted via the loading control terminal T1 is directly (that is, as a 1×amplification voltage Vc) inputted to the base of the second transistor Tr2a. At this time, when the input voltage Vin becomes 0 V due to a reason such as occurrence of abnormality, the amplification voltage Vc becomes 0 V. However, since the amplification voltage Vc is clamped to a nonzero voltage, a constant voltage can be secured as an output of the amplifier circuit 100 the same way as in the embodiment. Thereby, this modification can obtain the same effect as in the embodiment.

INDUSTRIAL APPLICABILITY

The present invention can be used for electronic equipment and the like which control the opening and closing of a tray.

What is claimed is:

1. An amplifier circuit, comprising:
   a differential circuit which generates an amplification voltage corresponding to a difference between an input voltage and a reference voltage;
   a first output circuit which generates a first output signal upon receipt of input of the amplification voltage from said differential circuit;
   a second output circuit which generates a second output signal upon receipt of input of the amplification voltage from said differential circuit; and
   a selector circuit which selects either the said first output circuit or said second output circuit,
   wherein when said first output circuit is selected by said selector circuit, said first output circuit outputs a voltage corresponding to the amplification voltage from said differential circuit and said second output circuit outputs a predetermined fixed voltage,
   wherein when said second output circuit is selected by said selector circuit, said second output circuit outputs a voltage corresponding to the amplification voltage from said differential circuit and said first output circuit outputs a predetermined fixed voltage,
   wherein said first output circuit includes a first clamp circuit which generates a clamp voltage so that the first output signal does not become a predetermined clamp voltage or below, irrespective of the amplification voltage from said differential circuit, and said first output circuit outputs the first output signal with a nonzero voltage in the event that the input voltage is equal to the reference voltage, and
   wherein said second output circuit includes a second clamp circuit which generates a clamp voltage so that the second output signal does not become a predetermined clamp voltage or below, irrespective of the amplification voltage from said differential circuit, and said second output circuit outputs the second output signal with a nonzero voltage in the event that the input voltage is equal to the reference voltage.

2. An amplifier circuit according to claim 1, further comprising a compensation circuit which compensates for temperature characteristics of the first clamp circuit and the second clamp circuit.

3. An amplifier circuit according to claim 1, wherein the first clamp circuit and the second clamp circuit are transistors of bipolar type.

4. An amplifier circuit, comprising:
   a first transistor in which an input voltage or a voltage corresponding to the input voltage is inputted to a base thereof and a collector thereof is grounded;
   a constant-current source connected with an emitter of said first transistor; and
   a second transistor in which a supply voltage is connected with an emitter thereof and a collector thereof is connected with a load,
   wherein a path from a connection point of said first transistor and said constant-current source to a base of said second transistor is selectively configured to be either in a conductive state or in a nonconductive state,
   wherein said first transistor generates a clamp voltage in a manner such that a voltage obtained from the connection point does not become a predetermined clamp voltage or below, and
   wherein when the path is in a conductive state, said second transistor retrieves the clamp voltage generated by said first transistor.

5. A semiconductor device, comprising:
   a differential circuit which generates an amplification voltage corresponding to a difference between an input voltage and a reference voltage;
   a first output circuit which generates a first output signal upon receipt of input of the amplification voltage from said differential circuit;
   a second output circuit which generates a second output signal upon receipt of input of the amplification voltage from said differential circuit;
   a selector circuit which selects either the said first output circuit or said second output circuit; and
   a load connected between a first output terminal that outputs the first output signal and a second output terminal that outputs a second output terminal,
   wherein when said first output circuit is selected by said selector circuit, said first output circuit outputs a voltage corresponding to the amplification voltage from said differential circuit and said second output circuit outputs a predetermined fixed voltage,
   wherein when said first output circuit is selected by said selector circuit, said second output circuit outputs a voltage corresponding to the amplification voltage from said differential circuit and said first output circuit outputs a predetermined fixed voltage,
   wherein said first output circuit includes a first clamp circuit which generates a clamp voltage so that the first output signal does not become a predetermined clamp voltage or below, irrespective of the amplification voltage from said differential circuit, and said first output circuit outputs the first output signal with a nonzero voltage in the event that the input voltage is equal to the reference voltage, and
   wherein said second output circuit includes a second clamp circuit which generates a clamp voltage so that the second output signal does not become a predetermined clamp voltage or below, irrespective of the amplification voltage from said differential circuit, and said second output circuit outputs the second output signal with a nonzero voltage in the event that the input voltage is equal to the reference voltage.

6. A semiconductor device including an amplifier circuit according to claim 1.

7. An electronic apparatus including a semiconductor device according to claim 1.

8. A semiconductor device including an amplifier circuit according to claim 4.

9. An electronic apparatus including a semiconductor device according to claim 6.

10. An electronic apparatus including a semiconductor device according to claim 7.

11. An electronic apparatus including a semiconductor device according to claim 8.

* * * * *